(12) United States Patent
Andre et al.

(10) Patent No.: US 8,984,379 B2
(45) Date of Patent: Mar. 17, 2015

(54) MRAM FIELD DISTURB DETECTION AND RECOVERY

(75) Inventors: Thomas Andre, Austin, TX (US); Syed M. Alam, Austin, TX (US); Bradley Engel, Chandler, AZ (US); Brian Butcher, Queen Creek, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 252 days.

(21) Appl. No.: 13/484,509

(22) Filed: May 31, 2012

(65) Prior Publication Data

US 2012/0311396 A1 Dec. 6, 2012

Related U.S. Application Data

(60) Provisional application No. 61/491,761, filed on May 31, 2011.

(51) Int. Cl.
| | |
|---|---|
| *H03M 13/00* | (2006.01) |
| *G06F 11/00* | (2006.01) |
| *G06F 11/10* | (2006.01) |
| *G11C 29/44* | (2006.01) |
| *H03M 13/11* | (2006.01) |

(52) U.S. Cl.
CPC ............ *G06F 11/1048* (2013.01); *G11C 29/44* (2013.01); *H03M 13/11* (2013.01)
USPC .............. 714/776; 714/751; 714/758; 714/52

(58) Field of Classification Search
CPC . G06F 11/1048; G06F 11/1044; G11C 29/44; H03M 13/11; H04L 5/026; H04L 5/023
USPC ........... 714/776, 779, 800, 746, 751, 758, 48, 714/52; 370/241, 242
See application file for complete search history.

(56) References Cited

U.S. PATENT DOCUMENTS

| | | | |
|---|---|---|---|
| 5,644,583 A * | 7/1997 | Garcia et al. ................... | 714/764 |
| 7,320,100 B2 | 1/2008 | Dixon et al. | |
| 7,536,612 B2 | 5/2009 | Abraham et al. | |
| 7,543,211 B2 * | 6/2009 | Nahas et al. ................... | 714/752 |
| 7,685,438 B2 | 3/2010 | Knudsen | |
| 7,747,926 B2 | 6/2010 | Wise et al. | |
| 8,111,544 B2 | 2/2012 | Chung et al. | |
| 8,255,758 B2 | 8/2012 | Anholt et al. | |
| 8,281,221 B2 | 10/2012 | Sakimura et al. | |
| 8,296,626 B2 | 10/2012 | Nazarian et al. | |
| 8,645,790 B2 * | 2/2014 | Lee et al. ....................... | 714/758 |
| 8,677,221 B2 | 3/2014 | Cornwell et al. | |
| 2007/0103967 A1 | 5/2007 | Boeve | |
| 2007/0153572 A1 | 7/2007 | Boeve | |

(Continued)

OTHER PUBLICATIONS

The International Bureau of WIPO, International Preliminary Report on Patentability for International Application No. PCT/US2012/040196, mailed Dec. 12, 2013.

Dutton, "Embedded Soft-Core Processor-Based Built-In Self-Test of Field Programmable Gate Arrays" Thesis submitted to Auburn University, May 14, 2010.

(Continued)

*Primary Examiner* — Christine Tu
(74) *Attorney, Agent, or Firm* — Lee & Hayes, PLLC

(57) ABSTRACT

A method and memory device is provided for reading data from an ECC word of a plurality of reference bits associated with a plurality of memory device bits and determining if a double bit error in the ECC word exists. The ECC word may be first toggled twice and the reference bits reset upon detecting the double bit error.

20 Claims, 2 Drawing Sheets

(56) References Cited

U.S. PATENT DOCUMENTS

| | | |
|---|---|---|
| 2007/0260962 A1 | 11/2007 | Wise et al. |
| 2009/0125787 A1 | 5/2009 | Sakimura et al. |
| 2009/0172481 A1 | 7/2009 | Cornwell et al. |
| 2009/0172496 A1 | 7/2009 | Roine |
| 2009/0187803 A1 | 7/2009 | Anholt et al. |
| 2010/0122146 A1 | 5/2010 | Nazarian et al. |
| 2010/0214825 A1 | 8/2010 | Chung et al. |

OTHER PUBLICATIONS

US Patent Office, International Searching Authority, "International Search Report" mailed Aug. 29, 2012; International Appln. No. PCT/US2012/40196, filed May 31, 2012.

European Search Reported dated Oct. 29, 2014 in EP 12 79 2839.

Extended European Search Report mailed Oct. 29, 2014 for European Patent Application No. 12792839.8, 6 pages.

\* cited by examiner

MRAM FIELD DISTURB DETECTION AND RECOVERY

This application claims the benefit of U.S. Provisional Application No. 61/491,761 filed 31 May 2011.

TECHNICAL FIELD

The exemplary embodiments described herein generally relate to error detection in memory devices and more particularly to error detection of reference bits used, for example, in connection with magnetoresistive random access memory (MRAM) devices.

BACKGROUND

In order to determine the state of a memory bit inside an array, it is common practice to compare the state of the array bit to the state of a pre-set reference. For example, a mid-point reference signal can be generated by averaging the signal from two reference bits, one in a high signal state, and one in a low signal state.

Memory devices commonly include some form of error correcting code (ECC) in the output logic circuitry. If a memory bit is disturbed from its desired state, or is otherwise read incorrectly, the ECC may be used to discover and possibly correct the memory output. It is not uncommon for reference bits to be disturbed (i.e., changed to an incorrect state) during processing, packaging, and/or at any other time. If a reference bit is disturbed from its original state, the memory bits compared to that reference bit may be subject to an unusually large number of read errors.

Prior art memory systems are incapable of efficiently recovering from the presence of one or more disturbed reference bits. Accordingly, most efforts have been centered on making memory devices more robust, i.e., lowering the rate which reference bit disturbs occurs.

The potential for an external field to manipulate MRAM data is a concern for applications with critical and/or secure data. For many of these applications, it is essential that they detect when the data has been disturbed; however, not necessary that the data be recoverable. A secondary concern is that a sufficiently strong external field will render the MRAM permanently non-functional. Two common fail modes resulting from a high external field, both of which cause a remnant elevated fail rate, are cladded line disturbs and reference bit disturbs. It would be desirable to recover functionality after the occurrence of either of those events.

The occurrence of a double bit failure in an ECC word is of sufficiently low probability that it is a good indicator that the accessed ECC word has been tampered with. However, monitoring a single word may not be sufficient since there will be a wide range of susceptibility across the device and other words can accumulate double bit fails while the monitored word remains correct. In addition, the known double bit error detection scheme is not guaranteed to detect all fails in excess of two (but, will usually detect any even number of fails). It may be possible when monitoring a single ECC word that an extreme disturb condition caused an undetectable number of fails. By monitoring a range of ECC words, the probability of detecting the first signs of tampering, as well as extreme disturbs, is increased.

Accordingly, there is a need for a memory device (e.g., a MRAM memory device) incorporating self-healing reference bit methods. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and structure is provided for a memory device incorporating self-healing reference bit.

In an exemplary embodiment, a method includes toggling an ECC word twice; reading the ECC word; and indicating that tampering has occurred if reading the ECC word indicates a double bit error.

In another exemplary embodiment, a method includes reading data from a ECC word of a plurality of reference bits; and determining if a double bit error in the ECC word exists.

In yet another exemplary embodiment, an array includes a plurality of array bits; a plurality of reference bits including an ECC word; and a detection module configured to read data from the ECC word; and indicate that tampering has occurred if a double bit error in indicated in the ECC word.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various clock components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
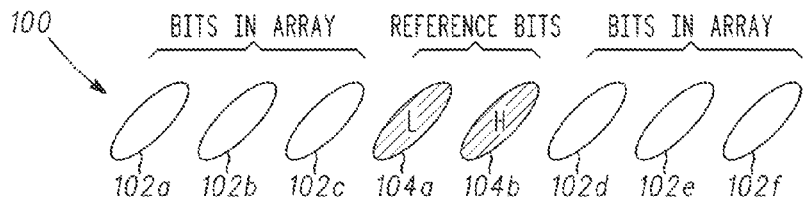
FIG. 1 is a conceptual diagram of an exemplary bit array and associated reference bits.

Referring to FIG. 1, a set of bits 100 includes a number of bits 102 ("array bits" or simply "bits") in an array (e.g., bits 102(a)-(f)) and one or more reference bits 104 (e.g., reference bits 104(a)-(b)) associated therewith. One reference bit 104(a) is designated "L" and nominally has a "low" signal (e.g., a low conductance value in an MRAM memory), and the other reference bit, 104(b), is designated "H" and nominally has a "high" signal (e.g., a high conductance value in an MRAM memory). Reference bits 104 are "associated with" bits 102 in the sense that they are used as references during a read operation performed on bits 102.

In FIG. 1, two reference bits 104 are illustrated. However, the present invention is not so limited, and may be implemented in memories utilizing single reference bits or any other number of reference bits. There may be, for example, 16 to 32 array bits per reference pair. Furthermore, the systems and methods described herein may be used in connection with an MRAM or any memory device that employs a midpoint generation scheme for reference bits.

Figure 2:
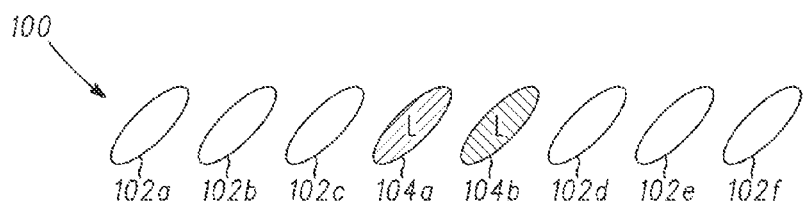
FIG. 2 depicts the bit array of FIG. 1 with a disturbed high reference bit.
Figure 3:
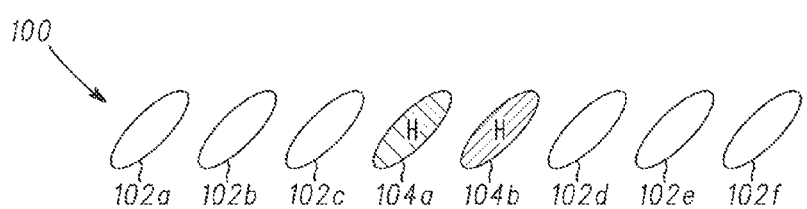
FIG. 3 depicts the bit array of FIG. 1 with a disturbed low reference bit.

It should be noted that all components of this exemplary embodiment as illustrated in FIGS. 2 and 3 that are similar to components of the exemplary embodiment of FIG. 1 are designated with like numbers.

It is not uncommon for reference bits to be disturbed (i.e., changed to an incorrect state) during processing, packaging, and/or at any other time. Thus, as shown in FIG. 2, reference bit 104(b)—which would typically have a 'high" signal— might be toggled to a "low' signal state. Likewise, as shown in FIG. 3, bit 104(a) might be toggled from its normal "low" signal state to a "high" signal state.

In FIG. 1, the average signal of reference bits 104 is (L+H)/2. For the error condition shown in FIG. 2, however, the average signal of reference bits 104 is reduced to (L+L)/2. In such a case, one or more low bits 102 may be incorrectly read as "high." On average, half of the read bits will be misread. Similarly, in FIG. 3, the average signal of reference bits 104 is abnormally high—i.e., (H+H)/2. This will result in one or more high bits 102 being incorrectly read as "low." As will be apparent, the presence of even one disturbed reference bit 104 can lead to multiple read errors with respect to any bits 102 associated with the disturbed reference bit 104.

In accordance with the exemplary embodiments, upon detecting a double bit error it is assumed that a disturb has occurred or that the write operation was degraded by exposure to an external field. While the data in the failing ECC word has been lost, there is a desire to regain functionality of the part with new data. A disturbed reference bit will render the associated ECC words non-functional. By performing an operation to reset the reference bits upon detection of a double bit failure, it is possible that the device regains functionality.

If resetting the reference bits is not successful in returning the device to full operation, it is likely that the write operation was degraded by cladded line disturbs. When an external field disturbs the cladding of a write line in the MRAM, the write error rate is increased, but, not necessarily to the point where a double bit error has a high probability of occurrence. A cladded line disturb can only be fixed through use of a high external field, however, for low frequency applications it may be possible to achieve a low error rate without fixing the cladded line disturb by using a write verify sequence. If the probability of a double bit error is very low, it can be reduced significantly by performing a read after each write to verify there is no double bit error, then, rewriting the data if a double bit error is detected. The probability that a double bit failure occurs twice is much lower than the probability it occurs once.

Since the MRAM is most susceptible to external field during write operations, an alternate, more sensitive means of detecting external field disturb is to periodically perform two toggle operations (Toggle MRAM enables switching the data to the opposite state without a prior read operation) followed by a read operation. If two bits failed to return to their original state (toggle twice), a double bit error will occur and be detected. As described previously, performing this method across multiple ECC words increases the probability of detecting the first signs of tampering, as well as extreme disturbs. In another exemplary embodiment, for example, spin-torque MRAM, toggle operation may comprise reading the bit states followed by writing the opposite state.

It is important to note that single bit errors are expected to occur at a significant enough rate that use of individual single bit errors is not sufficient to separate a tamper situation from the normally expected error rate. Also, single bit errors will be corrected with the ECC; therefore, are not an indication of any data loss. A use of double error detection as a means of identifying tampering due to its extremely low probability of occurrence without tampering and its association with data loss is described. At the first sign of tampering, where only a few ECC words on the device may have double bit errors and it is extremely unlikely a third error exists on any ECC word, all corrupted words will be identifiable by the double error detection circuitry. Only when a third error exists on an ECC word could that word be misinterpreted as correct; however, it is extremely likely that multiple other ECC words have detectable double bit errors before this occurs, which is why reading data from multiple ECC words before accepting the data as valid is taught herein. In the most extreme disturbs, typical double bit error detection circuitry has greater than a fifty percent chance of detecting any random corruption of any single ECC word.

One exemplary embodiment includes 1) use of double bit error detection ECC to identify when an accessed word has reached two fails, 2) use of multiple reads from different ECC words to guarantee no tampering has occurred, 3) alternately, use double forced writes to multiple ECC words for better sensitivity, 4) target the number of multiple ECC words to achieve a minimum detection rate, 5) use of a reference bit programming sequence upon detection of tampering, and 6) use of a write verify sequence to provide robust behavior under operation with cladded line reversal.

The exemplary embodiments are used to identify tampering in secure applications, and supports recovery and continued use. Reading from multiple ECC words increases the probability of detecting tampering.

Figure 4:
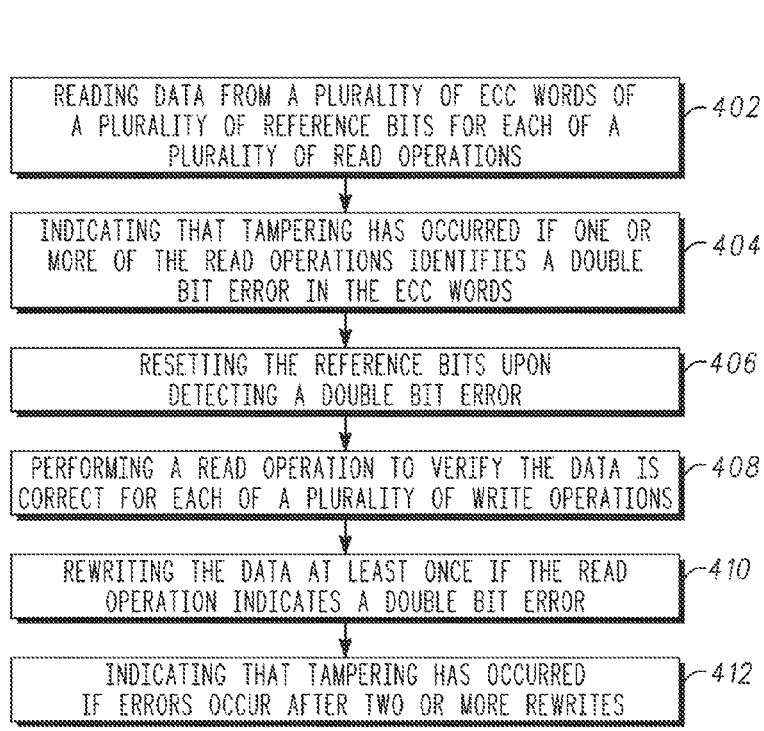
FIG. 4 is a flowchart illustrating a method for error detection in a memory in accordance with one embodiment.
Figure 5:
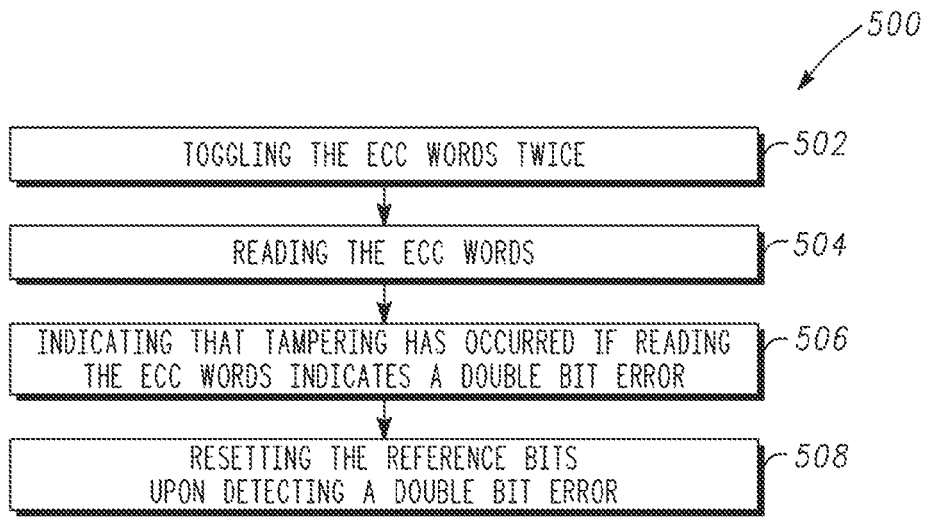
FIG. 5 is a flowchart illustrating a method for error detection in a memory in accordance with another embodiment.

FIGS. 4 and 5 are flow charts that illustrate exemplary embodiments of the error detection scheme disclosed herein. The various tasks performed in connection with processes 400 and 500 may be performed by software, hardware, firmware, or any combination thereof. For illustrative purposes, the following description of processes 400 and 500 may refer to elements mentioned above in connection with FIG. 1-3. In practice, portions of processes 400 and 500 may be performed by different elements of the described system, e.g., a processor or detection module. It should be appreciated that processes 400 and 500 may include any number of additional or alternative tasks, the tasks shown in FIGS. 4 and 5 need not be performed in the illustrated order, and processes 400 and 500 may be incorporated into a more comprehensive procedure or process having additional functionality not described in detail herein. Moreover, one or more of the tasks shown in FIGS. 4 and 5 could be omitted from an embodiment of the processes 400 and 500 as long as the intended overall functionality remains intact.

FIG. 4 is a flowchart depicting a method for detecting reference bit errors in accordance with one embodiment. These steps may be performed by a module within the memory or external to the memory, and may be implemented via hardware, software, firmware, or a combination thereof.

Initially, data is read from a plurality of ECC words of a plurality of reference bits for each of a plurality of read operations (step 402). As is known in the art, ECC schemes make use of an algorithm and additional bits to store information regarding the associated data bits. This added information can be used to determine errors in those data bits. An ECC memory might use, for example, block codes (e.g., Hamming codes) and convolutional tree codes, and may be implemented in hardware, software, firmware, or any combination thereof. An ECC has an error-detecting aspect as well as an error-correcting aspect. Thus, a particular ECC may be capable of detecting multiple bit errors but only capable of locating and correcting a single error. ECC algorithms include, for example, single-bit error correcting (SEC) algorithms and single-bit error correcting/double error detection (SECDED) algorithms. Such ECC algorithms are well known in the art, and need not be described in detail herein.

Regardless of the particular ECC used, the output of the ECC will typically include certain information related to the state of the data bit or bits that are read, e.g., a count of the number of errors as well as the locations (i.e., the physical locations) of the errors. The location of the corresponding reference bits(s) 104 will also be known. Thus, in step 404, an indication is made that tampering has occurred if one or more of the read operations identifies a double bit error in the ECC words, and in step 406, the reference bits are reset upon detecting a double bit error.

A read operation is performed to verify the data is correct for each of a plurality of write operations (step 408), and the data is rewritten at least once if the read operation indicates a double bit error (step 410). A further indication is made that tampering has occurred if errors occur after two or more rewrites (step 412).

FIG. 5 is a flowchart depicting an alternate embodiment in which it is assumed that two or more bits per reference pair can be read in a single operation. In this embodiment, the ECC words are toggled twice 502, and read 504. If a reading of the ECC words indicates a double bit error, an indication 506 is made that tampering has occurred, and the reference bits are reset 508 upon detecting of the double bit error.

In accordance with one embodiment, the detection and/or repair of reference bits is performed during regular memory operations, thus allowing for a transparent process and undisturbed operation of the memory. For example, ECC detection step 402 may be performed during any convenient read operation. Similarly, the steps of toggling a reference bit (step 506) may be performed during any convenient write operation. In this process, the references are checked and repaired substantially continuously. This helps prevent disturbed reference bits from impacting read reliability.

A log used to store the step in the flow and/or impacted addresses can be implemented using volatile or non-volatile elements. Use of non-volatile elements would prevent a power down event from interrupting the detection and correction sequence, but is not necessary for most applications. If non-volatile elements are used that require association with reference pairs, the bits associated with the log may be included in the ECC and reference detection scheme used.

Figure 6:
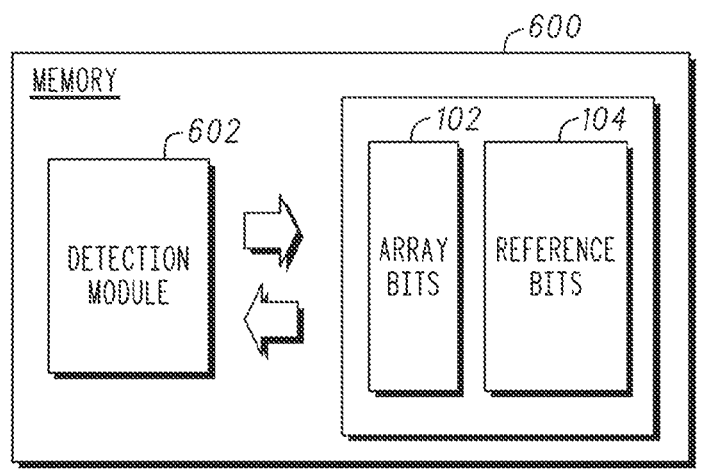
FIG. 6 is a conceptual block diagram of a semiconductor memory in accordance with one embodiment.

The functionality described above may be provided by any combination of hardware, software, firmware, and the like. Referring to the conceptual block diagram illustrated in FIG. 6, for example, an exemplary semiconductor memory 600 includes a set of array bits 102 associated with a set of reference bits 104. A detection module 602 is configured to perform one or more ECC error detection steps to detect the presence of errors with array bits 102 and toggle one of the reference bits 104 from one state to a second state if the error count associated with the ECC error detection step is greater than the predetermined threshold, as described above.

The detection module 602 may be implemented or realized with a general purpose processor, a content addressable memory, a digital signal processor, an application specific integrated circuit, a field programmable gate array, any suitable programmable logic device, discrete gate or transistor logic, discrete hardware components, or any combination designed to perform the functions described herein. A processor device may be realized as a microprocessor, a controller, a microcontroller, or a state machine. Moreover, a processor device may be implemented as a combination of computing devices, e.g., a combination of a digital signal processor and a microprocessor, a plurality of microprocessors, one or more microprocessors in conjunction with a digital signal processor core, or any other such configuration.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method comprising:
    toggling data bits associated with an error correction code (ECC) word of a memory device twice;
    reading the data bits associated with the ECC word from the memory device;
    detecting a double bit error associated with the data bits of the ECC word; and
    determining that the memory device has been tampered with based at least in part on detecting the double bit error associated with the data bits of the ECC word.

2. The method of claim 1, wherein the data bits associated with the ECC word include a plurality of reference bits.

3. The method of claim 2, further comprising resetting the plurality of reference bits upon detecting the double bit error.

4. The method of claim 1, further comprising:
    performing a read operation to verify data stored in the data bits is correct for at least one write operation;
    determining that that a first additional double bit error occurred for the read operation;
    rewriting the data at least once when the first additional double bit error occurred;
    determining if a second additional double bit error occurred after rewriting the data; and
    indicating that tampering has occurred if when errors occur after re-writing the data.

5. The method of claim 1, wherein the determining that the memory device has been tampered with includes determining that a disturb has occurred, a write operation was degraded by exposure to an external field, or both.

6. The method of claim 1, wherein the determining that the memory device has been tampered with includes determining that a write operation was degraded by cladded line disturbs.

7. The method of claim 1, further comprising indicating to at least one circuit coupled to the memory device that the memory device has been tampered with.

8. The method of claim 1, further comprising:
    reading data bits associated with a second ECC word;
    detecting a second double bit error associated with the data bits of the second ECC word; and
    determining that the memory device has been tampered with based at least in part on detecting the second double bit error associated with the data bits of the second ECC word.

9. A method comprising:
    reading data associated with an error correction code (ECC) word from a memory array, the data including at least one reference bit;
    detecting that a double bit error occurred within the data associated with the ECC word;
    re-setting the at least one reference bit;
    re-reading the data associated with the ECC word from the memory array;
    determining that the double bit error re-occurred within the data associated with the ECC word; and
    determining that the data was disturbed by exposure to an external field in response to detecting that the double bit error re-occurred within the data associated with the ECC word.

10. The method of claim 9, further comprising:
    reading data associated with a second ECC word;
    detecting that a double bit error occurred within the data associated with the second ECC word; and
    determining that the data read from the memory array was disturbed by exposure to an external field when the double bit error is detected within the data associated with the second the ECC word.

11. The method of claim 9, further comprising:
    re-writing the data in response to detecting the double bit error before re-reading the data.

12. The method of claim 11, further comprising determining that the memory array has been tampered with in response to detecting that the double bit error occurred after re-reading the data.

13. The method of claim 9, wherein the determining that the data read from the memory array was disturbed by exposure to an external field includes determining that at least one write operation was degraded by exposure to cladded line disturbs.

14. A memory device comprising:
    at least one array, the at least one array having a plurality of error correction code (ECC) words, individual ECC word of the plurality of ECC words including respective data bits and respective reference bits; and
    a detection module configured to:
        read the respective data bits and the respective reference bits associated with an ECC word of the plurality of ECC words from the array;
        determine that a double bit error occurred within the respective data bits and the respective reference bits associated with the ECC word; and
        determine that the memory device has been tampered with based at least in part on determining that the double bit error occurred.

15. The memory device of claim 14, wherein the detection module is further configured to toggle the respective data bits and the respective reference bits associated with the ECC word twice prior to reading the respective data bits and the respective reference bits associated with the ECC word.

16. The memory device of claim 14, wherein the detection module is further configured to reset the respective reference bits associated with the at least one ECC word upon detecting that the double bit error occurred.

17. The memory device of claim 14, wherein the detection module is further configured to
    indicate that tampering has occurred to at least one circuit associated with the memory device.

18. The memory device of claim 14, wherein the detection module is further configured to reset the respective reference bits upon the occurrence of the double bit error.

19. The memory device of claim 14, wherein the detection module is further configured to:
    read data bits and reference bits associated with a second ECC word of the plurality of ECC words from the array;
    determine that a second double bit error occurred within the respective data bits and the respective reference bits associated with the second ECC word; and
    determine that the memory device has been tampered with based at least in part on determining that the second double bit error associated with the second ECC word occurred.

20. The memory device of claim 14, wherein the determining that the memory device has been tampered with includes determining that a disturb has occurred, a write operation was degraded by exposure to an external field, or both.

* * * * *